United States Patent [19]
Augustoni et al.

[11] Patent Number: 5,175,757
[45] Date of Patent: Dec. 29, 1992

[54] APPARATUS AND METHOD TO ENHANCE X-RAY PRODUCTION IN LASER PRODUCED PLASMAS

[75] Inventors: Arnold L. Augustoni; James B. Gerardo; Thomas D. Raymond, all of Albuquerque, N. Mex.

[73] Assignee: Sandia Corporation-Org. 250, Albuquerque, N. Mex.

[21] Appl. No.: 571,253

[22] Filed: Aug. 22, 1990

[51] Int. Cl.$^5$ .............................................. H01J 35/08
[52] U.S. Cl. ................................. 378/120; 378/119; 378/143
[58] Field of Search ................. 378/119, 34, 143, 144, 378/120

[56] References Cited

U.S. PATENT DOCUMENTS

| | | | |
|---|---|---|---|
| 3,743,842 | 7/1973 | Smith et al. | 378/34 |
| 4,184,078 | 1/1980 | Nagel et al. | 378/34 |
| 4,205,278 | 5/1980 | George et al. | 372/57 |
| 4,700,371 | 10/1987 | Forsyth et al. | 244/7 A |
| 4,723,262 | 2/1988 | Noda et al. | 378/119 |
| 4,896,341 | 1/1990 | Forsyth et al. | 378/34 |
| 4,969,169 | 11/1990 | Forsyth et al. | 378/34 |

OTHER PUBLICATIONS

O'Neill et al., Laser-Plasma XUV . . . SPIE vol. 733 (1986), pp. 15–22.
Tooman et al., The Sandia Laser Plasma . . . SPIE vol. 664 (1986), pp. 186–191.
Hoffman et al., High Brightness Laser/Plasma . . . SPIE vol. 537 (1985), pp. 198–205.
Yaakobi et al., Submicron x-ray Lithography . . . Appl. Phys. Lett. 43(7), 1 Oct. 1983, pp. 686–688.
Chaker et al., Microlithography Using a Laser . . . SPIE vol. 923 (1988), pp. 20–27.
Chaker et al., Laser Created X-ray Sources . . . SPIE vol. 733 (1986), pp. 58–64.
Eason et al., Recent Applications of Laser-Produced . . . SPIE vol. 664 (1986), pp. 161–171.
Pepin et al., X-ray Sources for Microlithography . . . Feb. 1987, pp. 27–32.
Ze et al., Observation of Enhanced x-ray Emission . . . J. Appl. Phys. 66 (5) 1 Sep. 1989, pp. 1935–1939.
Davis et al., Plasma x-ray source for Lithography . . . Appl. Phys Lett 53 (17) 24 Oct. 1988, pp. 1583–1585.
Chaker et al., Laser Plasma x-ray Sources . . . J. Appl. Phys. 63 (3), 1 Feb. 1988, pp. 892–899.
O'Neill et al., X-Ray Emmission from Plasmas . . . Appl. Phys Lett 55 (25). 18 Dec. 1989, pp. 2603–2604.
T. D. Raymond et al., Quenched Laser Operation . . . SPIE vol. 912 (1988), pp. 67–72.

Primary Examiner—Janice A. Howell
Assistant Examiner—Don Wong

[57] ABSTRACT

Method and apparatus for generating x-rays for use in, for instance, x-ray photolithography. The method of generating x-rays includes the steps of providing a target and irradiating the target with a laser system which produces a train of sub-pulses to generate an x-ray producing plasma. The sub-pulses are of both high intensity and short duration. The apparatus for generating x-rays from a plasma includes a vacuum chamber, a target supported within the chamber and a laser system, including a short storage time laser.

10 Claims, 5 Drawing Sheets

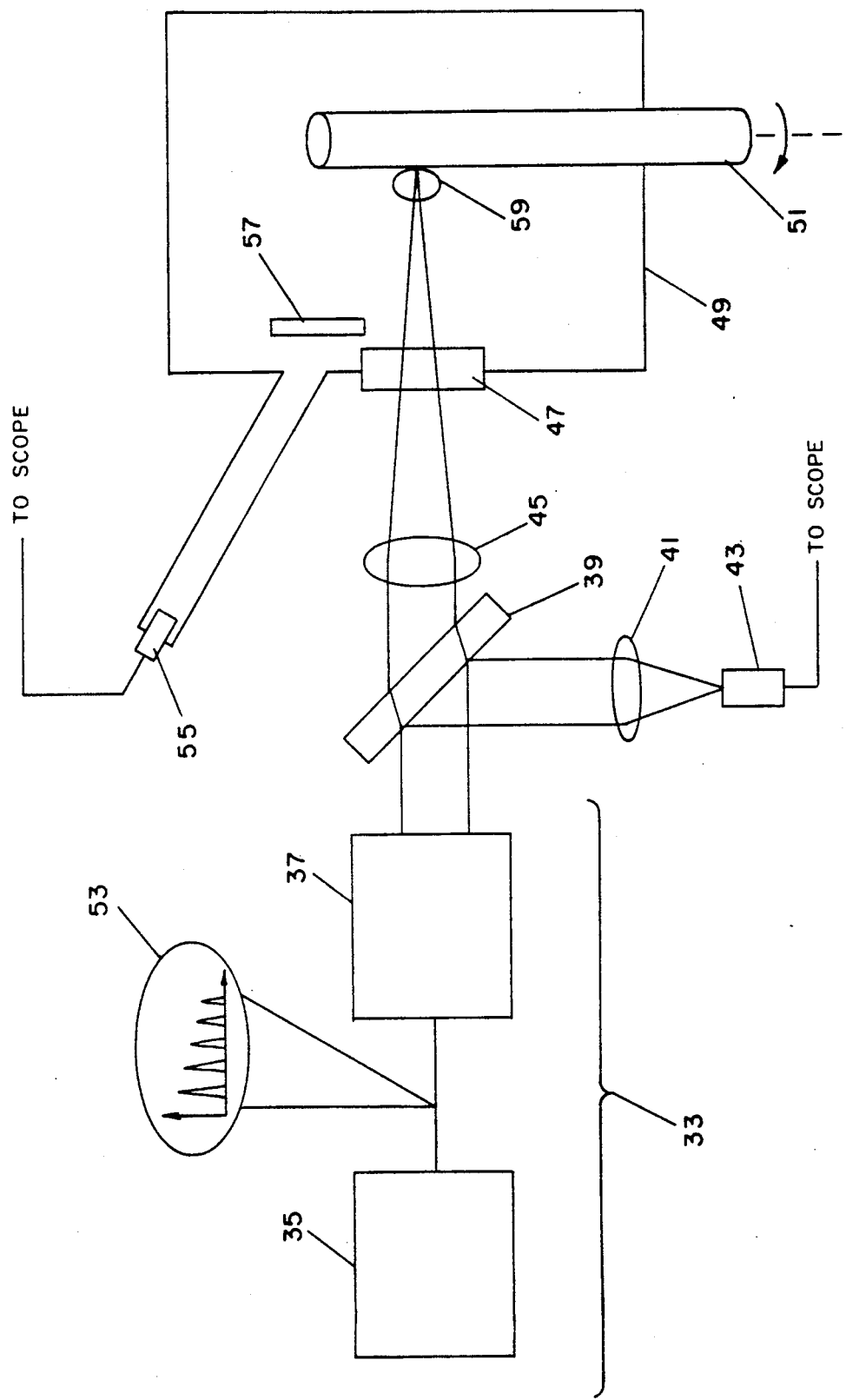

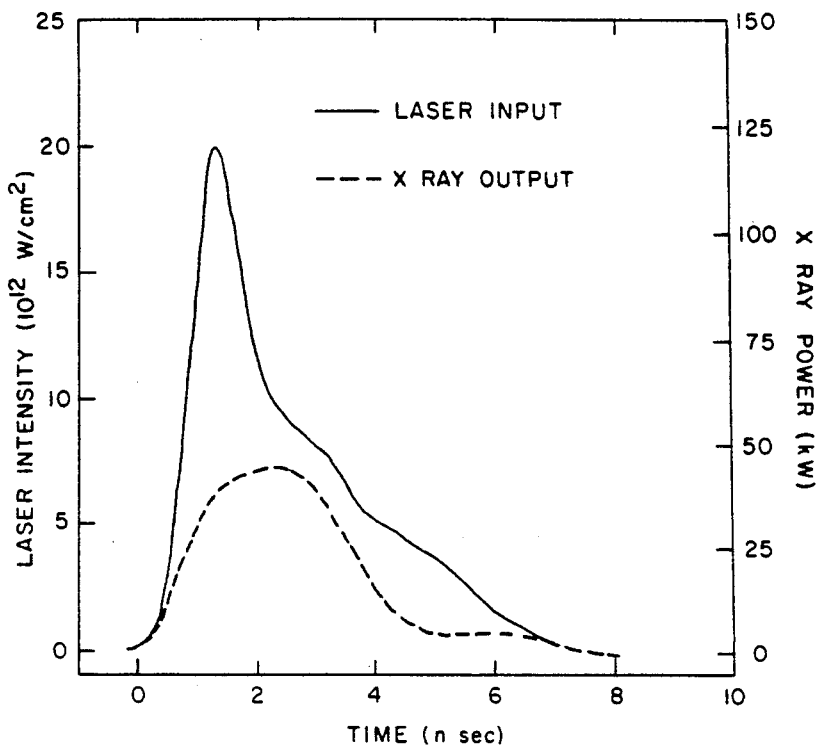
FIG—4a
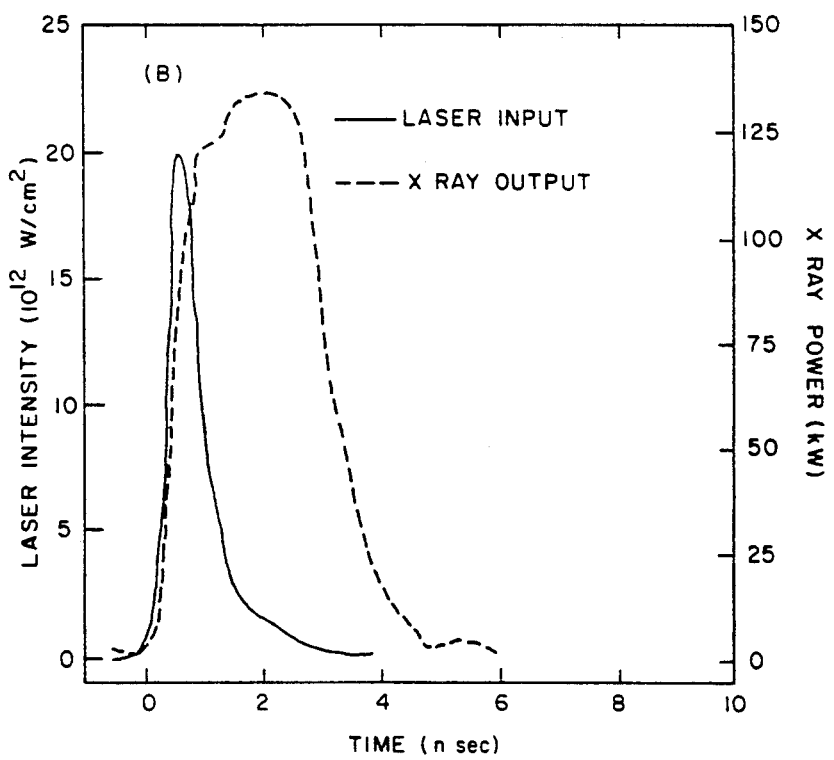
FIG—4b

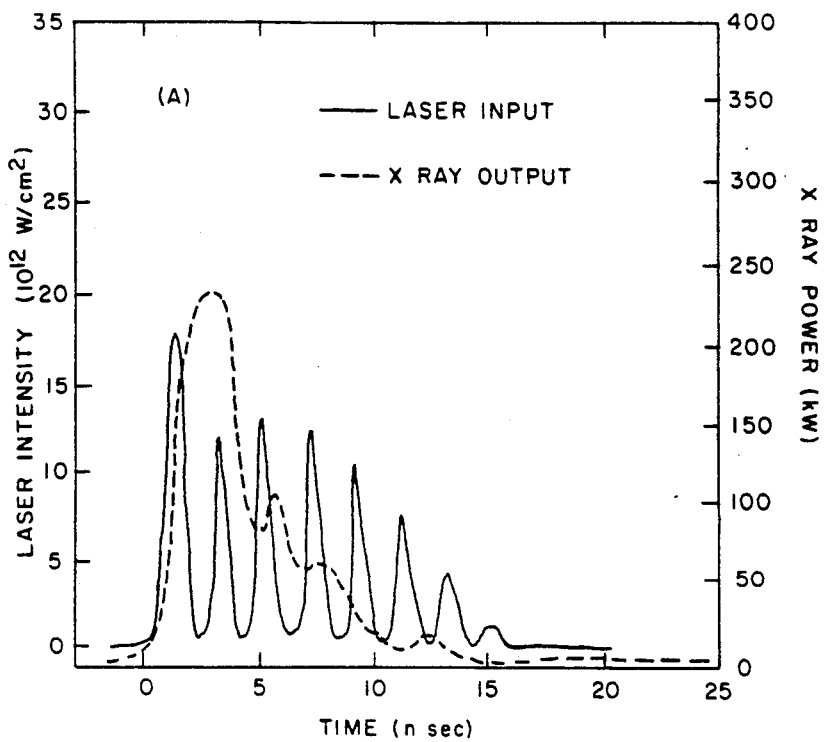
FIG—6a
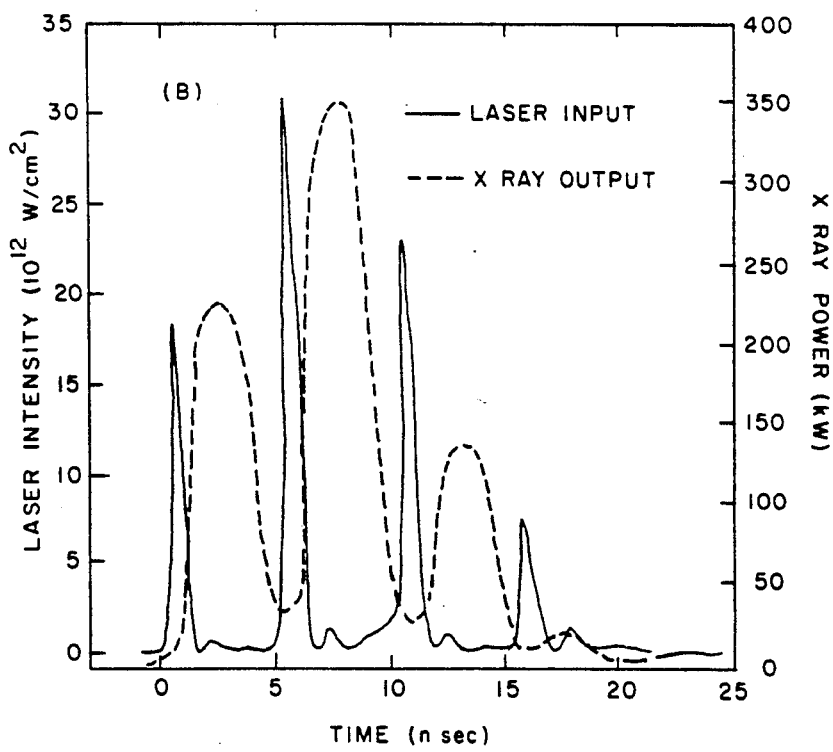
FIG—6b

APPARATUS AND METHOD TO ENHANCE X-RAY PRODUCTION IN LASER PRODUCED PLASMAS

The U.S. Government has rights in this invention pursuant to contract No. DE-AC04-76DP00789 between the Department of Energy and the American Telephone and Telegraph Company.

BACKGROUND

Optical lithography is currently the process of choice for the manufacture of microelectronic circuits (i.e., ICs). Lithography is used in IC manufacture to define the placement, shape and size of various features, such as gates, sources and drains, of field effect transistors, interconnects, trench capacitors and isolation trenches. The basic apparatus includes a source of radiation (typically a mercury lamp), a mask having the desired features, and a lens system for focusing the image of the mask onto an emulsion-coated chip.

Even with optimal optics and process control instrumentation, the minimum feature size obtainable with current lithography technology is limited to about 500 nm using near-UV radiation (365 nm). With the use of shorter wavelengths, such as UV radiation having wavelengths in the order of 250 nm and, again with optimal optics and process control methods, useful feature sizes as small as 350 nm may be obtainable.

Feature sizes even smaller than those described above are desirable for several reasons. If the minimum feature size is reduced to 100 nm, then, for a given size chip, the density of such features are increased in the order of 25 times greater than that obtainable with current technology. Signal processing speed is also increased because the transmission time of signals between, for instance, gates is reduced. The cost per chip decreases with increased density.

In order to produce smaller feature sizes electron beams or ion beams can be used to write patterns. An x-ray lithographic apparatus utilizing an electron beam is disclosed in the U.S. Pat. No. 3,743,042 to Smith et al. However, the writing speeds of such devices are too slow (and the cost is too high) for high volume manufacturing. For higher throughout synchrotrons, free electron lasers and laser produced x-rays are being considered. Though an x-ray source based on a synchrotron is feasible today from a technology standpoint, the cost is too expensive for cost effective manufacture of ICs. Research is being done to try to reduce the cost of synchrotrons that have relevant characteristics. However, even if this desired cost reduction is achieved, system reliability of this type of system will be an overriding issue. Free electron lasers may provide a route to sub 300 nm lithography Free electron lasers may provide a route to sub 300 nm lithography for high volume IC manufacturing, but a breakthrough in technology is needed to realize it, and cost and reliability will be even more of an issue for this technology than it is for synchrotron based systems.

To achieve the desired reduction in feature size, x-ray lithography based on laser produced x-rays is also being investigated and used on a limited basis. U.S. Pat. No. 4,184,078 to Nagel et al. discloses the use of a focused laser beam to produce a high temperature plasma which emits x-rays.

U.S. Pat. No. 4,700,371 to Forsyth et al. improves on Nagel et al. by showing that greater utility can be made of the laser target material by allowing multiple pulses from the laser to impinge on the same target area. They also teach that an enhancement in x-ray intensity can be obtained due to increased directionality of the x-ray radiation. Forsyth et al. require the existence of a cavity in the target material.

G. M. Davis, et al., Applied Physics Letters 53(17), p 1583 (1988), M. Chaker, et al., J. Applied Physics 63(3) p 892 (1988) and E. A. Crawford, et al., J. Vacuum Science Technology B5(6), p 1575 (1987) have demonstrated that point sources of x-rays radiating around 1 keV can be produced with optical-to-x-ray conversion efficiencies in excess of several percent in laser generated plasmas when the input laser intensity is greater than, about, $10^{13}$ W/cm$^2$. These results were obtained using laser wavelengths between 250 and 1060 nm and with laser pulse widths of a few nanoseconds or less.

FIG. 1 illustrates, in schematic form, the basic apparatus used in x-ray lithography. The apparatus includes a vacuum chamber 13 having a base pressure less than $10^{-3}$ Torr, a laser 15, focusing optics 17, a window 19 through which beam 20 enters chamber 13, a rod 21 (rotated by apparatus not shown) and apparatus, also not shown, for supporting and positioning a wafer 25 and a mask 29. Rod 21 may be of copper or other suitable metal or material. Wafer 25 has an x-ray resist 27 coated thereon. Mask 29 is positioned either in contact with resist 27 or in close proximity, to limit Fresnel diffraction and geometrical distortion. Rod 21 is rotated because each laser pulse vaporizes some material, which eventually will reduce the conversion efficiency. Instead of a rotating rod other devices, such as a moving foil, may be used.

The object of the apparatus of FIG. 1 is to generate, as nearly as possible, a point source of x-rays, of sufficient intensity and sufficient duration to properly expose resist 27. A typical resist exposure requirement would be 100 mJ/cm$^2$. In operation, a pulse of laser energy having a suitable spot size strikes rod 21, vaporizes a thin layer of material) heats and ionizes the vapor, to produce the x-ray generating plasma 30. Using subnanosecond duration pulses from Nd-glass or Nd:YAG lasers and intensities on target in the order of $10^{13}$ W/cm$^2$, x-rays in a narrow energy spectrum of 0.75–2.0 keV have been generated. This is the desired spectrum as it minimizes the combined broadening of images due to Fresnel diffraction and photo-electron range in the resist. The conversion efficiency from laser energy to x-ray energy in the desired wavelength band has been measured to be from 1% to 10%. For commercial systems high conversion efficiency is desired because the higher the efficiency the lower the system cost and the higher the expected system reliability.

While Nd-glass lasers are capable of high-energy, short duration pulses, they are limited to low repetition rates because thermal loading of the Nd-glass degrades the ability to focus the laser energy to the required small spot size on target. Also, excessive thermal loading will cause the laser glass to fracture. Reliability and costs of such Nd-glass lasers are also of concern, particularly for high volume manufacturing. At this time through-put (wafers/hour) of the only commercial system presently known to be available (manufactured by Hampshire Instruments, Inc., Marlborough, Massachusetts) is too small relative to its cost to find wide applications for high volume production.

Gas lasers, such as the KrF, XeCl, ArF, sometimes referred to as excimer lasers, and CO$_2$ lasers, are capable of multi-Joule output pulses at high repetition rates. They are also less expensive and more reliable than glass lasers having the same average power. Gas lasers can have more average power than glass lasers. Also, as the laser medium is gaseous, these lasers, in contrast to glass lasers, cannot be damaged catastrophically by optical feedback. Unfortunately, many of these laser systems store energy in their respective upper laser levels for times short compared to the time during which the upper laser level can be efficiently pumped. As a result, these short storage time lasers produce pulse durations that are determined by pump characteristics. Further, the long pulse widths associated with such gas lasers (greater than 20 nsec) make them unsuitable for the efficient production of the desired x-ray wavelengths. It is not practical to reduce these long pulse widths because of fundamental constraints on the limits of the electrical system used to power the discharge that excites the laser medium.

Since intensities on the order of $10^{13}$ W/cm$^2$ are required to generate x-rays efficiently, a focal spot size from a one-Joule-per-pulse gas or other short storage time laser of less than 25 $\mu$m would generally be necessary. This small spot size combined with the long pulse width results in plasmas with properties that are deleterious to efficient x-ray production. Indeed, G. M. Davis, et al, Applied Physics Letters 53(17), p 1583 (1988), have reported that x-rays in the energy range desired are produced only during the first few nanoseconds following gas laser irradiation; the remaining energy in the laser pulse being essentially wasted. This is illustrated in FIG. 2. Consequently, the poor x-ray production efficiency observed with gas lasers has essentially excluded these lasers from use in proximity x-ray photolithography.

In articles by T. D. Raymond (one of the co-inventors), C. Reiser, R. G. Adams, R. B. Michie and C. Woods, proceedings of the SPIE 912, p 67 (1988), hereinafter Raymond I, and T. D. Raymond, C. Reiser, R. G. Adams, R. B. Michie and C. Woods, proceedings of the SPIE 912, p 122 (1988), hereinafter Raymond II, the authors disclose a laser system by which energy efficient intensity enhancement can be obtained from gas lasers. The laser system consists of a dye-laser oscillator and a two-stage KrF laser amplifier to provide pulses of laser energy with pulse widths adjustable from 0.8 to 5 nsec, or trains of sub-pulses with interpulse timing adjustable from 2 to 5 nsec. The apparatus disclosed in these two articles was not used to generate x-rays.

While it is known, with the apparatus disclosed in Raymond I and II, to provide single pulses with adjustable pulse widths and trains of sub-pulses, no one has successfully used gas lasers in the efficient production of x-rays. Consequently, the poor x-ray production efficiency previously observed with gas lasers has essentially excluded these lasers from use in proximity x-ray photolithography. Applicants have solved this problem by recognizing that not only are high-intensity/short-duration pulses necessary for the efficient production of x-rays but the importance of spacing between such pulses.

In a paper published subsequent to applicants' invention, E. O'Neill et al., Applied Physics Letters 55(25) p 2603 (1989), disclose an improvement in x-ray production using a train of 100-psec pulses from a XeC laser. In the experiment described in this paper neither the pulse width nor the interpulse timing could be varied O'Neill et al. do not disclose: (1) that the conversion efficiency is strongly dependent on both pulse width and interpulse spacing; (2) that the optimum interpulse time depends on the time required for the election density to dissipate from the vicinity of the target; or (3) a model for plasma expansion that yields an expression for the minimum interpulse time versus focal spot size for optimum x-ray generation.

It is an object of the invention to use pulse train extraction of available laser energy from short storage time lasers (such as an excimer or gas laser) to both efficiently produce laser pulses and to efficiently convert the laser energy to x-ray energy.

It is another object of the invention to use short storage time laser initiated x-ray production in approximately the 0.75- 2.0 keV range, and preferably 0.80-1.3 keV range, by utilizing a train of short duration sub-pulses.

It is also another object of the invention to improve the conversion efficiency of laser energy to x-ray energy from short storage time lasers, including KrF, XeCl, ArF and $CO_2$ lasers.

SUMMARY OF THE INVENTION

Method and apparatus for generating x-rays for use in, for instance, x-ray photolithography. The method of generating x-rays includes the steps of providing a target and irradiating the target with a laser system which produces a train of sub-pulses to generate an x-ray producing plasma. The sub-pulses are of both high intensity and short duration. The sub-pulses also have an interpulse spacing, $\tau_s$s, which is at least equal to and, preferably, greater than the time, $\tau_d$, the time it takes for the plasma generated by the previous sub-pulse to dissipate, so that each sub-pulse interacts with an essentially fresh target. The duration, $\tau_p$, of each sub-pulse is defined as $\tau_p \geq D/V_c$, where D is the characteristic dimension of the laser spot at the surface of the target and $V_c$ is the characteristic expansion velocity of the critical density surface of the plasma. Preferably the interpulse spacing is in the range of 2.0 to 5.0 nsec, and the sub-pulses generated by a short storage time laser, such as an excimer laser. For the production of wafers, a wafer coated with a suitable x-ray photoresist and a mask are also provided. Preferably the mask is positioned in close proximity to the photoresist.

The apparatus for generating x-rays from a plasma includes a vacuum chamber, a target supported within the chamber and a laser system, including a short storage time laser, for generating a train of sub-pulses having both high intensity and short duration, as described above.

BRIEF DESCRIPTION OF THE DRAWINGS

FIG. 3 is a schematic of the apparatus of the present invention with x-ray detection apparatus in place of the wafer and mask illustrated in FIG. 1;

FIG. 4(a) is a trace illustrating the incident laser intensity of an approximately 2.0 nsec pulse from the apparatus of FIG. 3 and the resultant x-ray output energy (i.e., the area under the x-ray output curve) and the approximate x-ray power;

FIG. 4(b) is also a trace illustrating laser incident intensity of an approximately 0.8 nsec pulse, also from the apparatus of FIG. 3, and the resultant x-ray output energy and the approximate x-ray power;

FIG. 6(a) shows the x-ray output energy (i.e., the area under the x-ray output curve) and the approximate power obtained with the apparatus of the present invention with a train of subpulses having 2.0 nsec interpulse spacing; and FIG. 6(b) shows the x-ray output energy and the approximate power obtained with the apparatus of the present invention with a train of sub-pulses having 5.0 nsec interpulse spacing.

DETAILED DESCRIPTION

Figure 1:
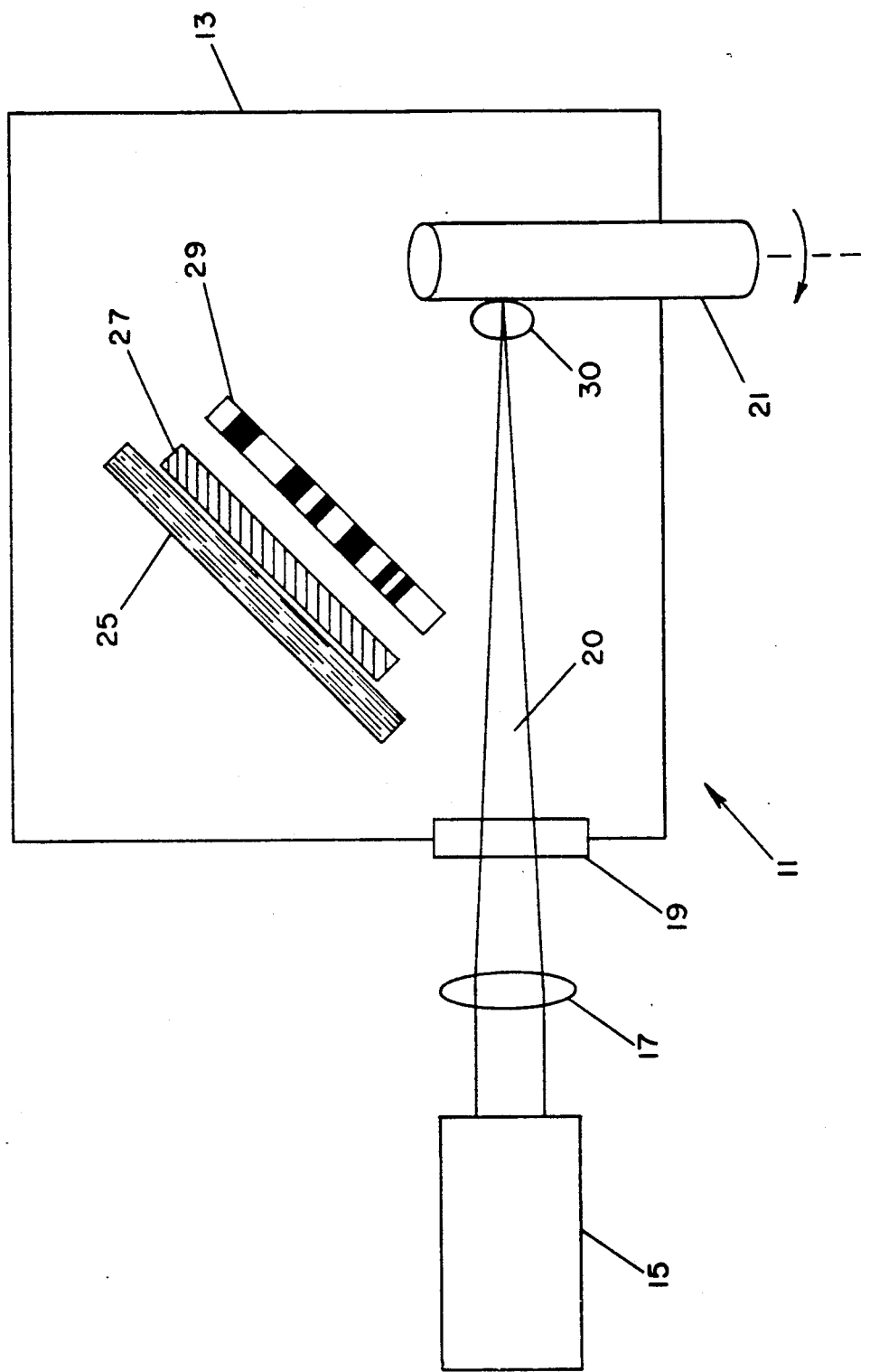
FIG. 1 is a schematic of a conventional x-ray lithographic apparatus.
Figure 2:
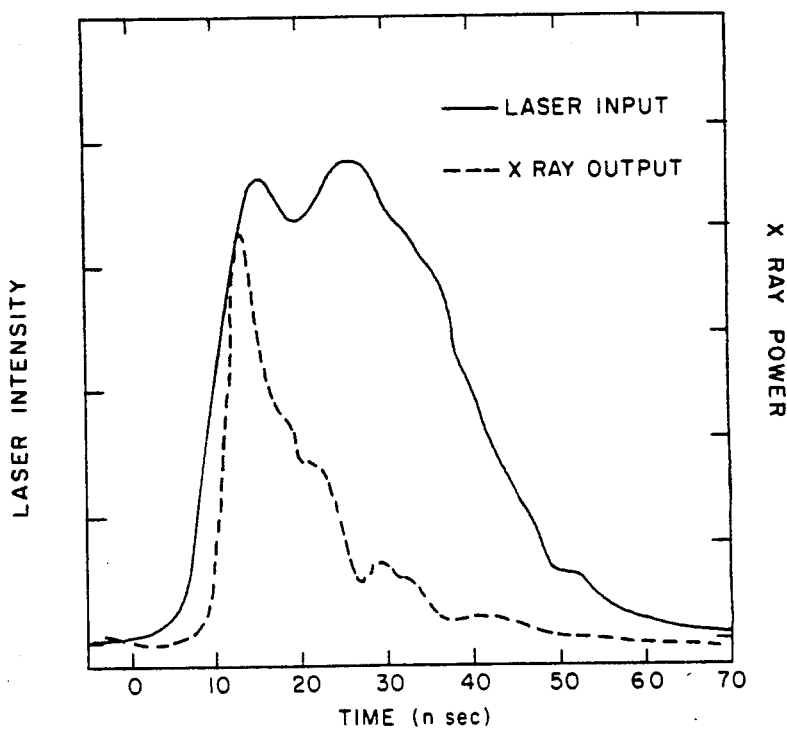
FIG. 2 is a graph illustrating both laser input intensity and x-ray output from the standard long pulse of a short storage time laser.

FIG. 3 illustrates x-ray generating apparatus 31, including a laser system 33 (composed, for example, of laser pulse train generator 35 and laser amplifier 37), beam divider 39, lens 41, LPD (laser photo diode) 43, lens 45, window 47, vacuum chamber 49 and target 51.

Laser pulse train generator 35 is any suitable apparatus for generating a train of pulses, each pulse having a series or train of sub-pulses, such as indicated by 53 in FIG. 3. Generator 35 includes a laser oscillator and apparatus for generating a beam of pulses as, for example, disclosed in greater detail in connection with FIG. 1 of Raymond I and FIG. 1 of Raymond II, both of which are incorporated by reference. Laser amplifier 37 may be a two stage system, including a KrF discharge-pumped excimer amplifier, a spatial filter and a beam expander, as illustrated and described in Raymond I. While other amplifier designs may be utilized, preferably amplifier 37 will include an excimer or other short storage time (i.e., the storage time is short compared to the pump duration time) laser amplifier. Single stage amplifiers may also be utilized.

While the apparatus illustrated in both Raymond I and Raymond II includes a dye laser oscillator, it would be preferable to utilize a gas or other short storage time laser. Thus, in a commercial application laser system 31 may be replaced with a design which is less complex, less expensive and more reliable. For example, such a system may be based on either active or passive mode locking concepts.

As is disclosed in Raymond I and II, the laser system 33 can be adjusted to provide single sub-pulses of laser energy with sub-pulse widths adjustable from 0.8 to 5 nsec. Furthermore, a train of such sub-pulses can be produced with sub-interpulse timing adjustable from 2 to 5 nsec.

The laser beam from amplifier 37 can be focused to intensities of up to $10^{13}$ W/cm$^2$ in focal spots of the order of 10 $\mu$m in diameter. Again with reference to FIG. 3, the beam is focused by lens 45 (which is an f/10 lens) through window 47 onto target 51, normal to the surface of target 51, to produce a spot diameter of 12±4 $\mu$m. Typically, target 51 is a high purity copper rod rotatably mounted, such as illustrated in U.S. Pat. No. 4,700,371 to Forsyth et al., in vacuum chamber 49. However, there would be no cavities in the target surface. Chamber 49 is evacuated to a pressure low enough to prevent the detrimental effects of air on x-ray production, typically less than $10^{-3}$ Torr With apparatus 31, $10^{-4}$ Torr was used.

With the laser intensity set forth above, each sub-pulse from amplifier 37 which strikes target 51 generates an x-ray producing plasma, as illustrated at 59 in FIG. 3.

To measure the x-ray production from plasma 59, in place of the wafer and mask illustrated in FIG. 1, an x-ray detector 55 is housed within vacuum chamber 49 and positioned at an angle of 20° from the target normal. The x-ray detector 55 consists of a silicone photodiode (Quantrad 004-PIN-124-M) or equivalent with a metal foil 57 (25 $\mu$m thick beryllium or aluminum) that serves to attenuate and spectrally filter the incident x-rays. The detector-to-target distance is selected so that it will not interfere with the plasma generated when the laser sub-pulses strike target 51. For instance, a distance of 2.3 cm is used with the aluminum filters; 19.1 cm with the beryllium filters. As those skilled in the art will appreciate, both detector 55 and LPD 43 are connected to an oscilliscope (not shown). Such a scope may also be used in the production of wafers (with suitable mask and wafer support apparatus positioned within chamber 49) to monitor both laser performance and exposure of the resist.

With the apparatus illustrated in FIG. 3, the laser energy incident On target 51 is calculated using standard techniques well known to those skilled in the art. Assuming a $cos^{0.6\theta}$ angular distribution for the x-rays, we convert the intercepted x-ray energy into a total x-ray energy yield. The conversion efficiency is defined as the ratio of the total x-ray energy yield to the total incident laser energy.

FIGS. 4(a) and 4(b) show typical oscilloscope traces (digitized for clarity) obtained with system 31. The positions of the laser and x-ray signals have been adjusted for clarity. As can be seen by comparing FIGS. 4(a) with 4(b), for equal peak incident laser intensity, the relative conversion efficiency for 0.8 nsec sub-pulses is substantially greater than that for 2 nsec sub-pulses. For a peak incident intensity of $2 \times 10^{13}$ W/cm$^2$, the conversion efficiency measured with 2-nsec FWHM (full width at half maximum) sub-pulses is 0.4% compared to, approximately, 2% for 0.8 nsec FWHM sub-pulses. With reference to FIG. 4(a), with laser energy of 24.8 mJ, the x-ray energy produced equaled 136 $\mu$J, resulting in a conversion efficiency of 0.4%. With reference to FIG. 4(b), with laser energy of 19.8 mJ the x-ray energy produced was 380 $\mu$J, resulting in a conversion efficiency of 1.9%. The response time of the x-ray signal is detector-limited, thus the xray power scale illustrated in FIGS. 4 is approximate. However, the area under this curve is a direct measure of the x-ray energy produced by the plasma.

Figure 5:
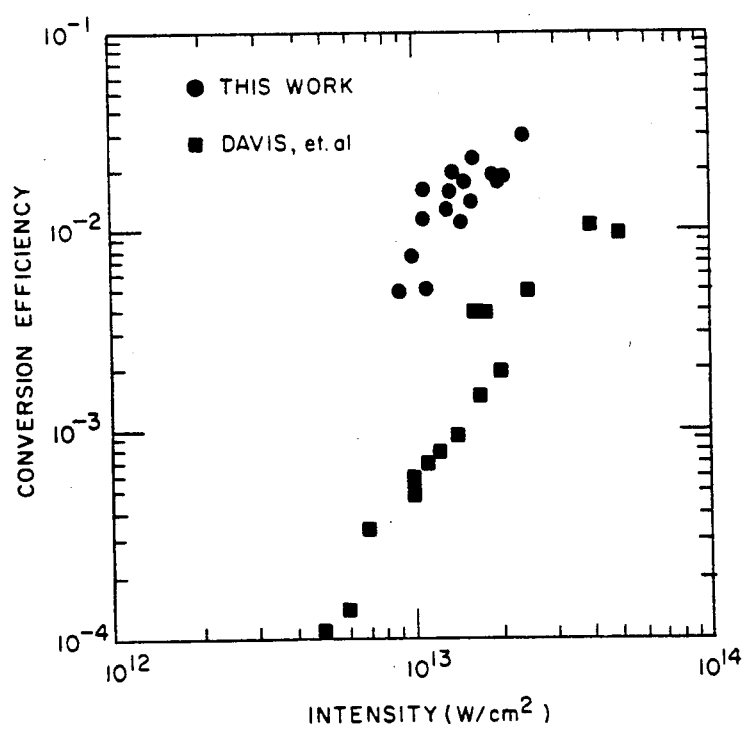
FIG. 5 compares the energy conversion efficiency data obtained with 0.8 nsec laser pulses generated by the apparatus of FIG. 3 to the results obtained by Davis et al.

FIG. 5 compares the conversion efficiency data obtained with a single 0.8 nsec FWHM sub-pulse to data obtained by Davis et al. with single, 25-nsec FWHM pulses. As can be seen from the drawing, a tenfold improvement in the conversion efficiency results from the use of the short sub-pulses.

With the apparatus illustrated in FIG. 3, we have determined that: the conversion efficiency for a train of 0.8 nsec sub-pulses is also much greater, for comparable peak intensity, than for a conventional longer-duration pulse; and the conversion efficiency increases with increasing time between sub-pulses. FIGS. 6(a) and 6(b) each show a single incident laser pulse train of equal energy but with, respectively, 2 nsec and 5 nsec sub-pulse separation. The net conversion efficiency increases from 0.4% for the 2 nsec FWHM pulse, to 1.1% and 3.5% for trains of 0.8 nsec FWHM sub-pulses with, respectively, 2 and 5 nsec sub-pulse timing. For 2 nsec separation between sub-pulses, total laser energy of 78.4 mJ and total x-ray energy produced of 1.02 mJ, the conversion efficiency was 1.3%. For 5 nsec separation between sub-pulses, total laser energy of 57.7 mJ and total x-ray energy produced of 2.03 mJ, the conversion efficiency converted to 3.5%. These results represent a significant improvement (about an order of magnitude) in conversion efficiency compared to that previously obtained using long pulse short storage time lasers.

We have developed a simple model which qualitatively predicts the observations set forth above. Central to this model is the existence of an electron-critical-density surface, which moves away from target 51 as plasma 59 expands. This surface is defined as the outermost region in which the local election density is equal to the critical election density for the incident laser wavelength. This critical-density surface is a region in both time and space where the index of refraction approaches zero, which effectively prevents a subsequent laser radiation from reaching the surface of target 51. The expansion of plasma 59 can be expected to become two-dimensional (i.e. two coordinates are need to characterize the expansion) on a time scale of, approximately $$\tau \simeq D/V_c$$

where $\tau$ is time, D is the laser focal spot diameter and $V_c$ is the characteristic expansion velocity of the critical-density shell.

Based on detailed computer calculations such as the LASNER simulations disclosed by Ze et al., Observation of Enhanced X-ray Emission From Long-Pulse-Width Laser-Produced Plasmas, J. Appl. Phys. 66(5), Sep. 1, 1989 (with regard fusion experiments which included long pulse laser radiation of a target, published subsequent to applicant's invention), we estimate $V_c$ for a copper target under the conditions set forth above with regard to the apparatus of FIG. 3 to be approximately 4 μm/nsec. Given a spot diameter of 10 μm, the expansion should become two-dimensional after about 2.5 nsec. For this spot size, the conversion efficiency to keV x-rays for pulses and sub-pulses longer than 2.5 nsec suffers because the electron-critical-density shell effectively cools and is ineffective for producing x-rays. The findings of Davis, et al. can also be explained with our model. Given their spot size of 25 μm, the above model predicts diminished x-ray production for times longer than about 6 nsec; they report a FWHM of 5 nsec for the x-rays produced in their experiment.

Our model demonstrates that continuous laser irradiation of the target for time periods greater than $\tau = D/V_c$ leads to inefficient production of keV range x-rays, because the critical-electron-density shell moves far enough from the surface of target 51 that the plasma is not heated to a temperature, in the order of 1,000,000° C., sufficient to generate x-rays. We recognize that this problem can be bypassed by using a train of sub-pulses, each pulse having a duration of $\tau_P$, with $\tau_P$ less than $\tau$, provided that each sub-pulse interacts with an essentially fresh target (i.e. unobscured by the plasma generated from the previous sub-pulse). This can be accomplished if the time between sub-pulses $\tau_s$, is at least equal to and preferably greater than the time required for the plasma (and electron) density generated by the previous sub- e pulse to dissipate well below the critical electron density for the incident laser frequency. An estimate of this plasma dissipation time, $\tau_d$, based on the sound velocity and $V_c$ suggests that between approximately 2 and 11 nsec is required between sub-pulses to maintain high conversion efficiency. This figure is consistent with the results obtained with the apparatus of FIG. 3, that the conversion efficiency continues to increase with increasing $\tau_s$ up to 5 nsec.

As those skilled in the x-ray lithography art will appreciate, depending upon the type of resist and its thickness, more than one train sub-pulses may be necessary for proper exposure.

Whereas the drawings and accompanying description have shown and described the preferred method and apparatus of the present invention, it will be apparent to those skilled in the art that various changes may be made in the form of the invention without effecting the scope thereof.

What is claimed is:

1. A method of generating x-rays, said method comprising the steps of:
   providing a target; and
   irradiating said target with a laser system which produces a train of sub-pulses to generate an x-ray producing plasma, each of said sub-pulses having sufficiently high intensity to generate an x-ray producing plasma from said target, said sub-pulses also having an interpulse spacing $\tau_s$ which is at least as long as the time $\tau_d$ it takes for plasma generated by the previous sub-pulse to dissipate, whereby each said sub-pulse interacts with an essentially fresh target.

2. The method as set forth in claim 1, wherein said sub-pulses have duration of $\tau_p$ where $\tau_p \geq D/V_c$, and D is the laser focal spot diameter at said target, and $V_c$ is the characteristic expansion velocity of the critical density surface of said plasma.

3. The method as set forth in claim 2, wherein said interpulse spacing is in the range of 2.0 to 5.0 nsec.

4. The method as set forth in claim 1, wherein said train of sub-pulses is generated using a short-storage-time laser amplifier having a short storage time compared to pump duration time.

5. The method as set forth in claim 4, wherein said short-storage-time laser amplifier is an excimer amplifier.

6. The method as set forth in claim 1 wherein the intensity of said laser sub-pulses is on the order of $10^{13} W/cm^2$.

7. A method of producing wafers having microelectronic circuits utilizing contact printing techniques and x-rays, said method comprising the steps of:
   providing a target;
   providing a wafer coated with a photoresist;
   providing a mask having the features to be etched on said wafer and positioning said mask between said target and said wafer, and adjacent to said wafer;
   providing a laser system which produces a train of sub-pulses; and
   irradiating said target with said laser system to generate an x-ray producing plasma, each of said sub-pulses having sufficiently high intensity to generate an x-ray producing plasma from said target, said sub-pulses also having an interpulse spacing $\tau_s$ which is at least as long as the time $\tau_d$ it takes for plasma generated by the previous sub-pulse to dissipate, whereby each said sub-pulse interacts with an essentially fresh target.

8. The method as set forth in claim 7, wherein said sub-pulses have duration of $\tau_p$, $\tau_p \leq D/V_c$, where D is the characteristic dimension of a spot produced by said laser system at said target, and $V_c$ is the characteristic expansion velocity of the critical density surface of said plasma.

9. The method as set forth in claim 8, wherein said interpulse spacing is in the range of 2.0 to 5.0 nsec.

10. Apparatus for generating x-rays from a plasma, said apparatus including:

a vacuum chamber;

a target supported within said chamber;

a laser system, said system including means for generating a train of sub-pulses having both sufficiently high intensity to generate an x-ray producing plasma from said target and a pulse width defined by $\tau_p \leq D/V_c$ where D is the laser focal spot diameter at said target, and $V_c$ is the characteristic expansion velocity of the critical density of surface of said plasma, and the time between sub-pulses is $\tau_s \geq \tau_d$, where $\tau_d$ is the time from the previous sub-pulse required for the plasma to dissipate in the region near the surface of said target to a level well below the critical density for the incident laser wavelength; and means for focusing said sub-pulses on said target.

* * * * *